(12) United States Patent  
Tubert

(10) Patent No.: US 9,774,333 B2
(45) Date of Patent: Sep. 26, 2017

(54) COUNTER CIRCUIT

(71) Applicant: STMicroelectronics (Grenoble 2) SAS, Grenoble (FR)

(72) Inventor: Cedric Tubert, Saint-Egreve (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 82 days.

(21) Appl. No.: 14/882,868

(22) Filed: Oct. 14, 2015

(65) Prior Publication Data

US 2017/0111049 A1 Apr. 20, 2017

(51) Int. Cl.
*H03K 23/54* (2006.01)

(52) U.S. Cl.
CPC .................................. *H03K 23/542* (2013.01)

(58) Field of Classification Search
CPC ...................................................... H03K 23/54
See application file for complete search history.

(56) References Cited

U.S. PATENT DOCUMENTS

| | | | | |
|---|---|---|---|---|
| 5,373,542 A | * | 12/1994 | Sunouchi | H03K 23/667 377/44 |
| 5,425,074 A | | 6/1995 | Wong | |
| 6,018,560 A | * | 1/2000 | Kim | H03K 23/62 377/123 |
| 7,003,067 B1 | * | 2/2006 | Younis | H03K 23/54 377/116 |
| 8,045,662 B2 | | 10/2011 | Zhuang et al. | |
| 2002/0075989 A1 | | 6/2002 | Joo | |

* cited by examiner

*Primary Examiner* — Hai L Nguyen
(74) *Attorney, Agent, or Firm* — Gardere Wynne Sewell LLP

(57) ABSTRACT

A counter circuit includes a first Johnson counter circuit and a second Johnson counter circuit coupled in cascade. Each Johnson counter circuit includes a clock input, a data input, a first clock data output, a second clock data output and a feedback from the second clock data input to first data input. The clock input of the first Johnson counter circuit is configured to receive an input clock signal. The clock input of the second Johnson counter circuit is connected to the second clock data output of the first Johnson counter circuit. A ripple counter circuit has a clock input and additional clock data outputs. The clock input of the ripple counter circuit is connected to the second clock data output of the preceding Johnson counter circuit.

14 Claims, 4 Drawing Sheets

US 9,774,333 B2

COUNTER CIRCUIT

TECHNICAL FIELD

The present disclosure generally relates to electronic circuits and, more particularly, to counter circuits.

BACKGROUND

Reference is now made to FIG. 1 showing a block diagram of an n-bit Johnson counter circuit 10. The counter circuit 10 includes n flip-flops 12(l)-12(n) arranged in cascade with the output of one flip flop 12 coupled to the data input of a next flip flop. The output of the last flip-flop 12(n) is fed back to the data input of the first flip-flop 12(l) with a signal inversion. The clock inputs (>) of each of the included flip-flops 12 are coupled to receive a common clock signal (CLK). The output bits Q1-Qn of the counter circuit 10 are taken at the corresponding outputs of the included flip-flops 12. In an embodiment, the flip-flops 12 comprise D-type flip-flops as well known to those skilled in the art. Each D-type flip-flop 12 includes a data input D and a pair of complementary data outputs Q and QB. The Q output of one flip-flop is coupled to the data input D of the succeeding flip flop, and the QB output of the last flip-flop is coupled to the data input D of the first flip-flop (thus implementing the data inversion, which could instead be implemented using a logic inverter connected to the Q output). The counter circuit 10 functions as divider of the clock signal CLK to produce n output clock signals Q1-Qn, with each output clock signal having a frequency equal to the clock signal frequency divided by 2n and being phase shifted relative to each other by the period of the clock signal. See, FIG. 1A for output waveforms for an n=4 Johnson counter.

Reference is now made to FIG. 2 showing a block diagram of an m-bit ripple counter circuit 20. The counter circuit 20 includes m flip-flops 22(l)-22(m) arranged in cascade with the data output of one flip flop 12 coupled to the clock input (>) of a next flip flop. More specifically, the output of a previous flip-flop 22 is coupled to the clock input of a succeeding flip-flop. A complementary data output of each flip-flop 22 is coupled to the data input D of that same flip-flop. The first flip-flop 22 is coupled to receive an input clock signal CLK at its clock input. The output bits Q1-Qm of the counter circuit 20 are taken at the corresponding data outputs of the included flip-flops 22. In an embodiment, the flip-flops 22 comprise D-type flip-flops as well known to those skilled in the art. Each D-type flip-flop 22 includes a data input D and a pair of complementary data outputs Q and QB. The Q output of one flip-flop is coupled to the clock input of the succeeding flip flop, and the QB output of each flip-flop is coupled to the data input D of that same flip-flop (alternatively, an inverter circuit may be coupled to the Q output to provide the inverted feedback to the data input). The counter circuit 20 functions as divider of the clock signal CLK to produce n output clock signals Q1-Qn, with each output clock signal having a frequency equal to one half of the signal received at its clock input. See, FIG. 2A for output waveforms for m=4.

There is a need for an improved counter circuit operable at a reduced power consumption.

SUMMARY

In an embodiment, a counter circuit comprises: a first Johnson counter circuit having a first clock input and a first plurality of clock data outputs; a second Johnson counter circuit having a second clock input and a second plurality of clock data outputs; wherein the first clock input is configured to receive an input clock signal; and wherein the second clock input is connected to one of the first plurality of clock data outputs.

A ripple counter circuit having a third clock input and a third plurality of clock data outputs may be included in the counter circuit, with the third clock input connected to one of the second plurality of clock data outputs.

In an embodiment, a counter circuit comprises: a first Johnson counter circuit having a first clock input, a first data input, a first clock data output, a second clock data output and a feedback from the second clock data input to first data input; a second Johnson counter circuit having a second clock input, a second data input, a third clock data output, a fourth clock data output and a feedback from the fourth clock data input to second data input; wherein the first clock input is configured to receive an input clock signal; and wherein the second clock input is directly connected to the second clock data output.

A ripple counter circuit having a third clock input and a plurality of additional clock data output may be included in the counter circuit, with the third clock input connected to the fourth clock data output.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
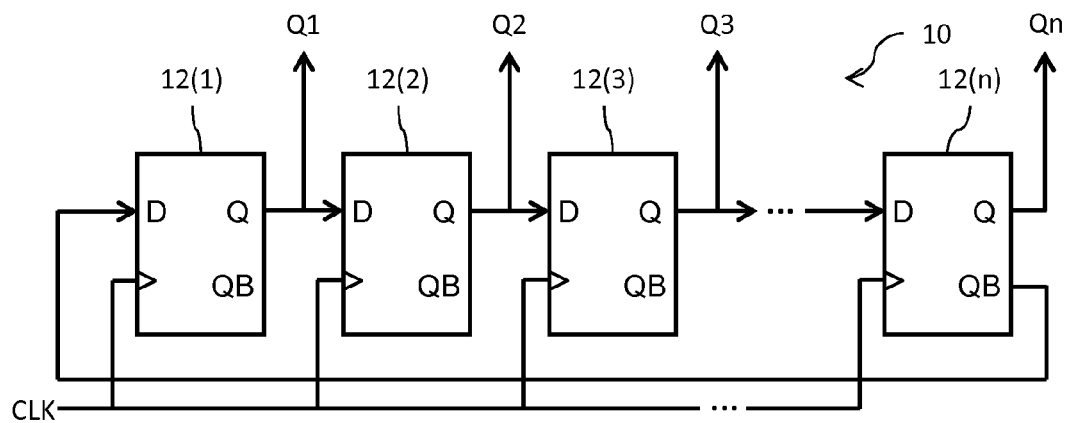
FIG. 1 shows a block diagram of an n-bit Johnson counter.
Figure 1A:
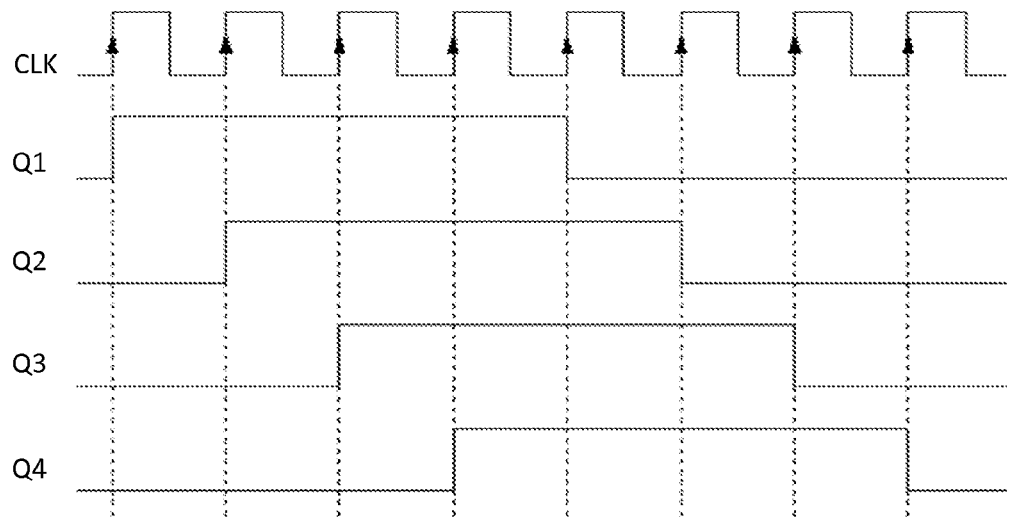
FIG. 1A shows output waveforms for an n=4 bit Johnson counter.

The same elements have been designated with the same reference numerals in the different drawings. In particular, the structural and/or functional elements common to the different embodiments may be designated with the same reference numerals and may have identical structural, dimensional, and material properties. For clarity, only those steps and elements which are useful to the understanding of the described embodiments have been shown and will be detailed. In particular, the circuits powered by the power converter have not been detailed, the described embodiments being compatible with usual applications. In the following description, when reference is made to terms "about", "approximately", or "in the order of", this means to within 10%, preferably to within 5%.

Figure 3:
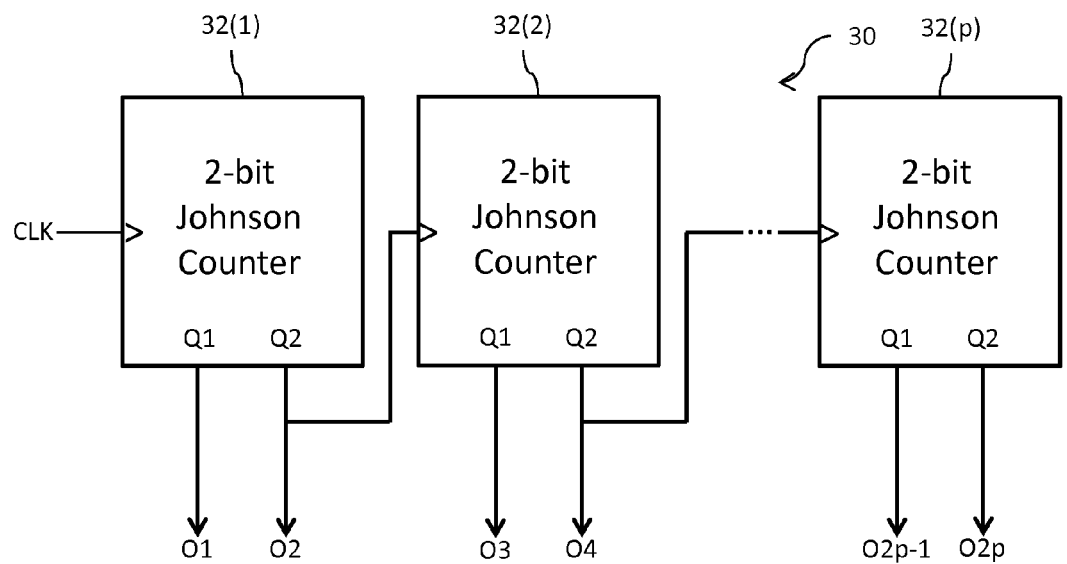
FIG. 3 is a block diagram for a counter circuit embodiment.

Reference is now made to FIG. 3 showing a block diagram for an embodiment of a counter circuit 30. The counter circuit 30 comprises a plurality of Johnson counter circuits 32(1)-32(p) coupled in cascade. A first one of the Johnson counter circuits 32(1) includes a clock input (>) configured to receive an input clock signal CLK. A data output of each Johnson counter circuit 32 (for example, output Q2) is coupled to the clock input of a succeeding Johnson counter circuit 32.

Figure 3A:
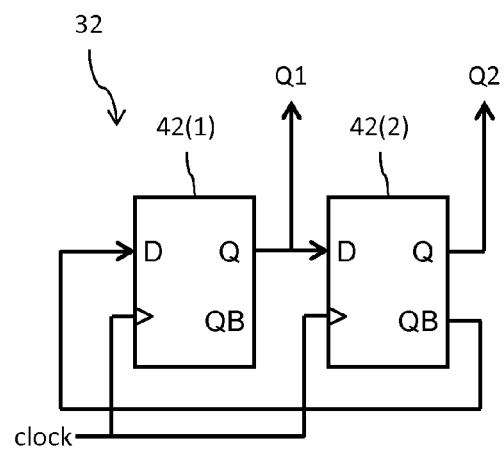
FIG. 3A is a block diagram of a 2-bit Johnson counter circuit as used within the counter circuit of FIG. 3.

Each Johnson counter circuit 32 is preferably a 2-bit Johnson counter circuit as shown in FIG. 3A. The Johnson counter circuit 32 includes two flip-flops 42(1)-42(2) arranged in cascade with the data output of the first flip flop 42(1) coupled to the data input of the second flip flop 42(2). The data output of the second flip-flop 42(2) is fed back to the data input of the first flip-flop 42(1) with a signal inversion. The clock inputs (>) of each of the included flip-flops 42 are coupled to receive a common clock signal. The output bits O1-O2 of the counter circuit 32 are taken at the corresponding data outputs of the included flip-flops 42. In an embodiment, the flip-flops 42 comprise D-type flip-flops as well known to those skilled in the art. Each D-type flip-flop 12 includes a data input D and a pair of complementary data outputs Q and QB. The Q output of the first flip-flop 42(1) is coupled to the data input D of the second flip flop 42(2), and the QB output of the second flip-flop 42(2) is coupled to the data input D of the first flip-flop 42(1) (alternatively implemented using an inverter circuit coupled to the Q output to provide the data inversion in feedback). The circuit 32 functions as divider of the received clock signal to produce two output clock signals Q1-Q2, with each output clock signal having a frequency equal to the clock signal frequency divided by 4 and being phase shifted relative to each other by the period of the clock signal.

The counter circuit 30 produces, from the p Q1 outputs and p Q2 outputs of the included counter circuits 32, 2p output clocks O1-O2p. FIG. 3B shows the output waveforms for the first four outputs O1-O4. The counter circuit 30 presents advantages over a corresponding m-bit ripple counter (like that shown in FIG. 2) wherein m=2p. The four least significant bits (LSBs) of the ripple counter consume more than 90% of the overall power of the counter circuitry. In the counter circuit 30, the 4 LSBs of the counter circuit are implemented by two 2-bit Johnson counters 32 in cascade. The Johnson counter implements four D flip-flop commutations per counting cycle while a correspondingly sized ripple counter implements six D flip-flop commutations per counting cycle. The 2-bit Johnson counter thus has a theoretical 33% power savings compared to the ripple counter. Use of the Johnson counter in at least the positions of the LSBs which undergo the most logic state changes significantly reduces power consumption. Power savings of 14-16% or more for counters have been measured by simulation with the counter circuit 30 in comparison to a correspondingly sized ripple counter like that of FIG. 2.

Figure 4:
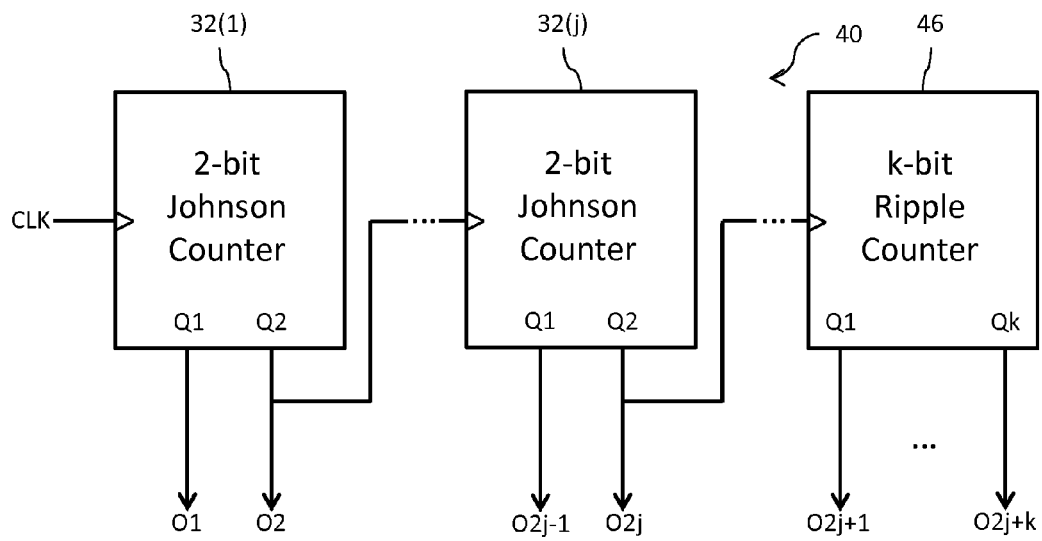
FIG. 4 a block diagram for a counter circuit embodiment.

Reference is now made to FIG. 4 showing a block diagram for an embodiment of a counter circuit 40. The counter circuit 40 comprises a plurality of Johnson counter circuits 32(1)-32(j) coupled in cascade with each other (in an example, j=2) and with a k-bit ripple counter 46. In this embodiment, the Johnson counter circuits 32 provide the LSBs outputs Ol-O2j and the ripple counter 46 provides the most significant bits (MSBs) outputs O2j+1-O2j+k.

A first one of the Johnson counter circuits 32(l) includes a clock input (>) configured to receive an input clock signal CLK. A data output of each Johnson counter circuit 32 is coupled to the clock input of a succeeding Johnson counter circuit 32. A data output of the last Johnson counter circuit 32(j) is coupled to the clock input of the k-bit ripple counter 46.

Each Johnson counter circuit 32 is preferably a 2-bit Johnson counter circuit as shown in FIG. 3A. The Johnson counter circuit 32 includes two flip-flops 42(1)-42(2) arranged in cascade with the data output of the first flip flop 42(1) coupled to the data input of the second flip flop 42(2). The data output of the second flip-flop 42(2) is fed back to the data input of the first flip-flop 42(1) with a signal inversion. The clock inputs (>) of each of the included flip-flops 42 are coupled to receive a common clock signal. The output bits Q1-Q2 of the counter circuit 32 are taken at the corresponding data outputs of the included flip-flops 42. In an embodiment, the flip-flops 42 comprise D-type flip-flops as well known to those skilled in the art. Each D-type flip-flop 12 includes a data input D and a pair of complementary data outputs Q and QB. The Q output of the first flip-flop 42(1) is coupled to the data input D of the second flip flop 42(2), and the QB output of the second flip-flop 42(2) is coupled to the data input D of the first flip-flop 42(1) (alternatively, an inverter circuit could be connected to the Q output to provide the signal inversion in feedback). The counter circuit 32 functions as divider of the received clock signal to produce two output clock signals Q1-Q2, with each output clock signal having a frequency equal to the clock signal frequency divided by 4 and being phase shifted relative to each other by the period of the clock signal.

Figure 2:
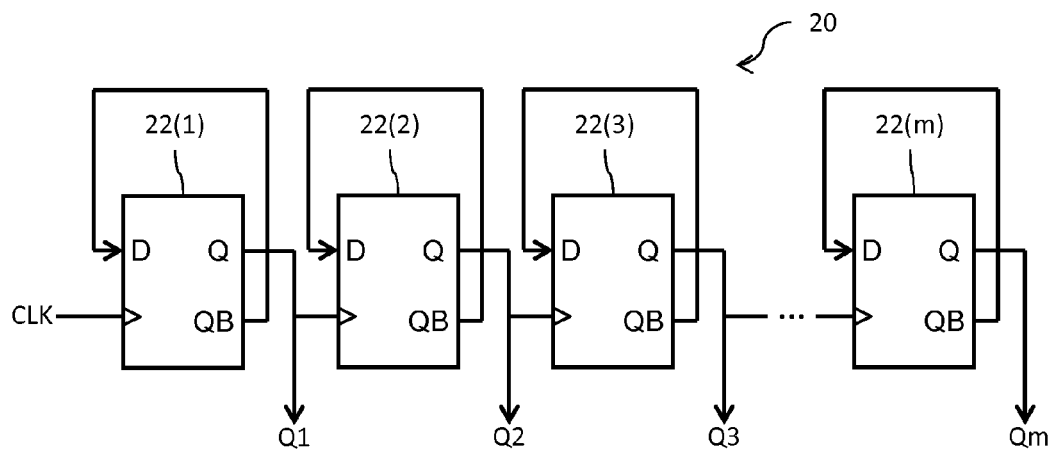
FIG. 2 shows a block diagram of an m-bit ripple counters.
Figure 2A:
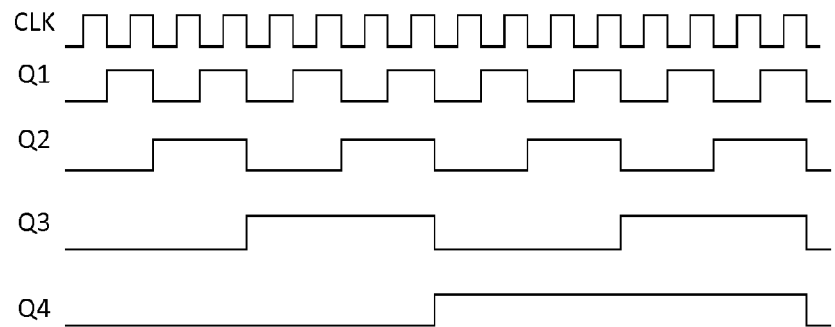
FIG. 2A shows output waveforms for an m=4 bit ripple counter.
Figure 3B:
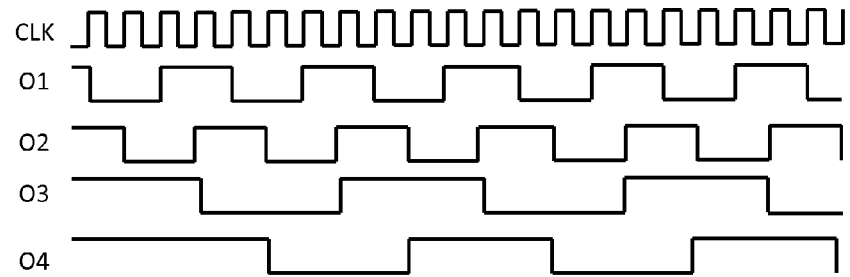
FIG. 3B shows output waveforms for the circuit of FIG. 3.

The k-bit ripple counter 46 may have a circuit configuration as shown in FIG. 2 (where m=k).

Simulation of the counter 40 reveals an approximately 30% reduction in power consumption when compared to a conventional ripple counter of equal number of bits (like that of FIG. 2). This reduction in power consumption is attributed to the use of the Johnson counter circuits 32 for the LSBs. A further reduction in power may be accomplished through efficient layout of the circuit components (for example, by implementation of measures for compactness such as with a minimization of source/drain diffusion area for the transistors). This further reduction may be on the order of an additional 30%.

Various embodiments have been described. Various alterations, modifications, and improvements will readily occur to those skilled in the art. Further, the practical implementation of the embodiments which have been described is within the abilities of those skilled in the art based on the functional indications given hereabove.

The invention claimed is:

1. A counter circuit, comprising:
    a first Johnson counter circuit having a first clock input and a first plurality of clock data outputs;
    a second Johnson counter circuit having a second clock input and a second plurality of clock data outputs;
    wherein the first clock input is configured to receive an input clock signal; and
    wherein the second clock input is connected to one of the first plurality of clock data outputs.

2. The counter circuit of claim 1, further comprising a ripple counter circuit having a third clock input and a third plurality of clock data outputs; wherein the third clock input is connected to one of the second plurality of clock data outputs.

3. The counter circuit of claim 2, wherein the first and second pluralities of clock data outputs provide least significant bits of an output counter signal and wherein the third plurality of clock data outputs provide most significant bits of said output counter signal.

4. The counter circuit of claim 1, wherein the first and second Johnson counter circuits are each implemented as two-bit Johnson counter circuits.

5. The counter circuit of claim 1, wherein the second clock input is directly connected to said one of the first plurality of clock data outputs.

6. The counter circuit of claim 1, further comprising:
a third Johnson counter circuit having a third clock input and a third plurality of clock data outputs;
wherein the third clock input is connected to one of the second plurality of clock data outputs.

7. The counter circuit of claim 6, further comprising a ripple counter circuit having a fourth clock input and a fourth plurality of clock data outputs; wherein the fourth clock input is connected to one of the third plurality of clock data outputs.

8. The counter circuit of claim 7, wherein the first and second pluralities of clock data outputs provide least significant bits of an output counter signal and wherein the fourth plurality of clock data outputs provide most significant bits of said output counter signal.

9. The counter circuit of claim 6, wherein the first and second pluralities of clock data outputs provide least significant bits of an output counter signal and wherein the third plurality of clock data outputs provide most significant bits of said output counter signal.

10. A counter circuit, comprising:
a first Johnson counter circuit having a first clock input, a first data input, a first clock data output, a second clock data output and a feedback from the second clock data input to first data input;
a second Johnson counter circuit having a second clock input, a second data input, a third clock data output, a fourth clock data output and a feedback from the fourth clock data input to second data input;
wherein the first clock input is configured to receive an input clock signal; and
wherein the second clock input is directly connected to the second clock data output.

11. The counter circuit of claim 10, further comprising a ripple counter circuit having a third clock input and a plurality of additional clock data outputs; wherein the third clock input is connected to the fourth clock data output.

12. The counter circuit of claim 11, wherein the first through fourth clock data outputs provide least significant bits of an output counter signal and wherein the additional clock data outputs provide most significant bits of said output counter signal.

13. The counter circuit of claim 10, further comprising:
a third Johnson counter circuit having a third clock input, a third data input, a fifth clock data output, a sixth clock data output and a feedback from the sixth clock data output to third data input;
wherein the third clock input is directly connected to the fourth clock data output.

14. The counter circuit of claim 13, wherein the first through fourth clock data outputs provide least significant bits of an output counter signal and wherein the fifth through sixth clock data outputs provide most significant bits of said output counter signal.

* * * * *